United States Patent
Chu et al.

(10) Patent No.: US 9,794,992 B1
(45) Date of Patent: Oct. 17, 2017

(54) UNIVERSAL METHOD FOR DRIVING LEDS USING HIGH VOLTAGE

(71) Applicant: VastView Technology Inc., Hsinchu County (TW)

(72) Inventors: Hung-Chi Chu, Hsinchu County (TW); Yuhren Shen, Hsinchu County (TW)

(73) Assignee: VastView Technology Inc., Hsinchu County (TW)

( * ) Notice: Subject to any disclaimer, the term of this patent is extended or adjusted under 35 U.S.C. 154(b) by 0 days.

(21) Appl. No.: 15/496,029

(22) Filed: Apr. 25, 2017

Related U.S. Application Data

(60) Provisional application No. 62/367,125, filed on Jul. 27, 2016.

(51) Int. Cl.
  *H05B 37/02* (2006.01)
  *H05B 33/08* (2006.01)
  *G01R 19/04* (2006.01)

(52) U.S. Cl.
  CPC ......... *H05B 33/0842* (2013.01); *G01R 19/04* (2013.01); *H05B 33/083* (2013.01); *H05B 37/0227* (2013.01)

(58) Field of Classification Search
  CPC ............ H05B 37/0227; H05B 33/0842; H05B 33/083; G01R 19/04
  USPC .................................................. 315/291, 193
  See application file for complete search history.

(56) References Cited

U.S. PATENT DOCUMENTS

| | | | | |
|---|---|---|---|---|
| 8,786,202 B2* | 7/2014 | Kim | ................... | H05B 33/0824 |
| | | | | 315/191 |
| 9,167,651 B2* | 10/2015 | Roberts | ................ | H05B 33/083 |
| 9,345,085 B2* | 5/2016 | Jung | ..................... | H05B 33/083 |
| 2009/0230883 A1* | 9/2009 | Haug | ................... | H05B 33/083 |
| | | | | 315/297 |
| 2011/0025216 A1* | 2/2011 | Ching-Chi | ......... | H05B 33/0824 |
| | | | | 315/186 |
| 2014/0159597 A1* | 6/2014 | Sun | ..................... | H05B 33/0803 |
| | | | | 315/193 |
| 2014/0210351 A1* | 7/2014 | Yu | ......................... | H05B 33/083 |
| | | | | 315/122 |
| 2014/0217908 A1* | 8/2014 | Chiang | ................ | H05B 33/083 |
| | | | | 315/186 |
| 2015/0069908 A1* | 3/2015 | Fukui | ................. | H05B 33/0815 |
| | | | | 315/82 |
| 2015/0091455 A1* | 4/2015 | Yu | ...................... | H05B 33/0824 |
| | | | | 315/193 |
| 2015/0230298 A1* | 8/2015 | Chu | ..................... | H05B 33/083 |
| | | | | 315/186 |

(Continued)

*Primary Examiner* — Don Le
(74) *Attorney, Agent, or Firm* — Lin & Associates Intellectual Property, Inc.

(57) ABSTRACT

An apparatus for driving LEDs using high voltage includes two LED driving circuits and two switches that can be turned on or off by a universal controller so as to connect the two LED driving circuits in two different configurations. When the input voltage is in a range from rectified 90 volt AC to rectified 140 volt AC, the two switches are controlled in such a way that the two LED driving circuits are connected in parallel. When the input voltage $V_{IN}$ is in a range from rectified 180 volt AC to rectified 265 volt AC, the two switches are controlled to connect the LED segments of the LED unit in one LED driving circuit in series with the other LED driving circuit.

23 Claims, 13 Drawing Sheets

(56) References Cited

U.S. PATENT DOCUMENTS

2016/0007416 A1\* 1/2016 Viviani ................ H05B 33/083
 315/200 R
2016/0095179 A1\* 3/2016 Jang ..................... H05B 33/083
 315/125

\* cited by examiner

UNIVERSAL METHOD FOR DRIVING LEDS USING HIGH VOLTAGE

CROSS-REFERENCE TO RELATED APPLICATION

This application claims the priority benefit of U.S. provisional patent application No. 62/367,125, filed on Jul. 27, 2016, which is incorporated herewith by reference, and is related to U.S. Pat. No. 8,847,501, issued Sep. 30, 2014, which is also incorporated herewith by reference.

BACKGROUND OF THE INVENTION

1. Field of the Invention

The present invention relates generally to light emitting diode (LED) based lighting apparatus, and more particularly to an apparatus and method for driving an LED based lighting apparatus using high input voltage.

2. Description of Related Arts

LEDs are semiconductor-based light sources often employed in low-power instrumentation and appliance applications for indication purposes in the past. The application of LEDs in various lighting units has also become more and more popular. For example, high brightness LEDs have been widely used for traffic lights, vehicle indicating lights, and braking lights. In recent years, because of the energy saving advantage, high voltage LED-based lighting apparatus have been developed and deployed to replace the conventional incandescent and fluorescent lamps.

An LED has an I-V characteristic curve similar to an ordinary diode. When the voltage applied to the LED is less than a forward voltage, only very small current flows through the LED. When the voltage exceeds the forward voltage, the current increases sharply. The output luminous intensity of an LED light is approximately proportional to the LED current for most operating values of the LED current except for the high current value. A typical driving device for an LED light is designed to provide a constant current for stabilizing light emitted from the LED and extending the life of the LED.

In order to increase the brightness of an LED light, a number of LEDs are usually connected in series to form an LED-based lighting string and a number of LED-based lighting strings may further be connected in series to form a lighting apparatus. The operating voltage required by each lighting string typically is related to the forward voltage of the LEDs in each lighting string, how many LEDs are employed for each of the lighting strings and how they are interconnected, and how the respective lighting strings are organized to receive power from a power source.

Accordingly, in many applications, some type of voltage conversion device is required in order to provide a generally lower operating voltage to one or more LED-based lighting strings from more commonly available higher power supply voltages. The need of a voltage conversion device reduces the efficiency, costs more and also makes it difficult to miniaturize an LED-based lighting device.

In order to increase the efficiency and miniaturize the LED-based lighting apparatus, many techniques have been developed for the apparatus to use operating voltages such as 110 volt AC or 220 volt AC without requiring a voltage conversion device. In general, the LEDs in the apparatus are divided into a number of LED segments that can be selectively turned on or off by associated switches or current sources, and a controller is used to control the switches or current sources as the operating AC voltage increases or decreases.

As more and more LED-based lighting apparatus are used in high brightness lighting equipment with high input voltage, there is a strong need to design methods and apparatus that can drive and connect the LED-based lighting strings intelligently and efficiently by using the readily available AC source from a wall power unit which provides a high voltage.

SUMMARY OF THE INVENTION

The present invention has been made to provide a method and apparatus that can efficiently drive an LED string with an AC voltage in different high voltage range such as from 90 volts to 140 volts or from 180 volts to 265 volts as its input voltage.

According to one preferred embodiment of the present invention, the LED lighting apparatus comprises two LED driving circuits controlled by a universal controller. The universal controller controls two switches that can be turned on or off so as to connect the two LED driving circuits in two different configurations. In addition, the LED current flowing through one of the LED driving circuits is also controlled by the universal controller according to the variation in the input voltage.

Each of the LED driving circuits comprises an LED unit having a plurality of LEDs divided into a plurality of LED segments with each LED segment having an associated voltage controlled current limiting device connected to a common node. Except for the first and last LED segments, each LED segment has a positive end and a negative end connected respectively to the negative end of its preceding LED segment and the positive end of its following LED segment. A power-loss reduction circuit and a current source connect in series from the common node to ground for the LED driving circuit in this embodiment.

A first switch connects the positive end of the first LED segment of the first LED driving circuit to the positive end of the first LED segment of the second LED driving circuit, and a second switch connects the negative end of the last LED segment of the first LED driving circuit to the positive end of the first LED segment of the second LED driving circuit. The input voltage is connected to the positive end of the first LED segment of the first LED driving circuit and the universal controller.

When the input voltage is in a range from rectified 90 volt AC to rectified 140 volt AC, the first switch is turned on and the second switch is turned off by the universal controller so that the two LED driving circuits are connected in parallel. When the input voltage $V_{IN}$ is in a range from rectified 180 volt AC to rectified 265 volt AC, the first switch is turned off and the second switch is turned on to connect the LED segments of the LED unit in the first LED driving circuit in series with the second LED driving circuit. The universal controller also sends a current setting signal to control the current of the current source of the first LED driving circuit according to the variation in the input voltage.

In the preferred embodiment, the current setting signal is controlled by a voltage sensing signal which can be detected by directly sensing the input voltage, or detecting a related node voltage in the LED driving circuits. In a modified version of the preferred embodiment, a current sensing signal is fed back to the universal controller from the current source of the second LED driving circuit and used as the voltage sensing signal to control the current flowing through the current source of the first LED driving circuit according to the current flowing through the current source of the second LED driving circuit.

According to another preferred embodiment of the present invention, the two LED driving circuits share a common current source instead of each having its own current source. The two LED units and the two switches are connected in the same way as in the preferred embodiment described above. However, in each LED driving circuit, the power-loss reduction circuit is connected in series with a voltage controlled current limiting device between its own common node and the shared common current source.

In addition to controlling the two switches to connect the two LED driving circuits in parallel or to connect the LED segments of the LED unit in the first LED driving circuit in series with the second LED driving circuit, the universal controller in this embodiment sends two separate voltage control signals to respectively control the two voltage controlled current limiting devices connected to the shared common current source and a current setting signal to control the current flowing through the shared common current source.

In accordance with the present invention, because the current flowing through the shared common current source is twice of the current flowing through each LED driving circuit when the two LED driving circuits are connected in parallel, the voltage level of the current setting signal sent from the universal controller has to be twice of the voltage level of the current setting signal when the LED segments of the two LED units are connected in series. As a result, the universal controller has to provide two different voltage levels for the current setting signal.

In a modified version of the shared common current source, two current setting resistors are provided in the current source. One of the current setting resistors can be controlled by the universal controller so as to connect in parallel with the other current setting resistor in order to provide a current twice of the current flowing through each LED driving circuit without requiring two voltage levels from the universal controller. The signal that controls the first switch can be used as the current selecting signal for the modified version of the shared common current source to control the parallel connection of the current setting resistors. As a result, the circuit of the universal controller can be simplified.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
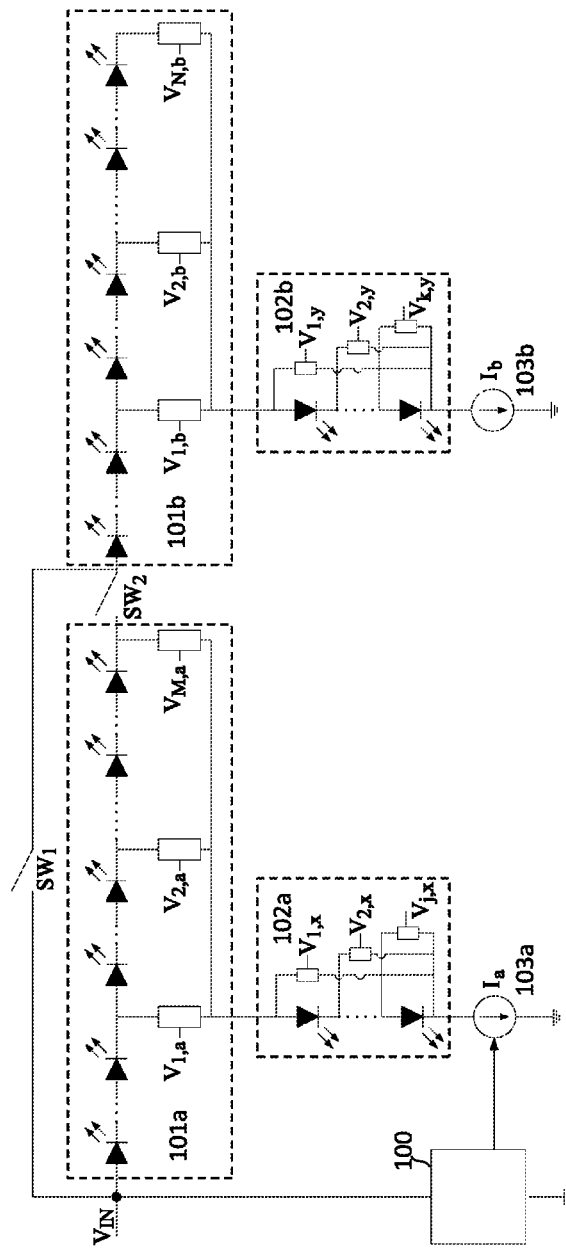
FIG. 1 shows a block diagram of an apparatus for driving LEDs using high voltage according to a preferred embodiment of the present invention.

The accompanying drawings are included to provide a further understanding of the invention, and are incorporated in and constitute a part of this specification. The drawing illustrates embodiments of the invention and, together with the description, serves to explain the principles of the invention.

FIG. 1 shows a block diagram of an apparatus for driving LEDs using high voltage according to a preferred embodiment of the present invention. In the embodiment, the apparatus comprises two LED driving circuits and two switches SW1, SW2 controlled by a universal controller 100. The LED driving circuit shown on the left side of FIG. 1 includes an LED unit 101a connected in series with a power-loss reduction circuit 102a and a current source 103a. The LED driving circuit shown on the right side of FIG. 1 includes an LED unit 101b connected in series with a power-loss reduction circuit 102b and a current source 103b.

The LED unit 101a has a plurality of LEDs connected with a plurality of voltage controlled current limiting devices controlled by bias voltages $V_{1,a}, V_{2,a}, \ldots, V_{M,a}$, and the LED unit 101b has a plurality of LEDs connected with a plurality of voltage controlled current limiting devices controlled by bias voltages $V_{1,b}, V_{2,b}, \ldots, V_{N,b}$. The universal controller 100 controls how the two switches SW1 and SW2 are turned on or turned off to connect the two LED driving circuits according to the input voltage $V_{IN}$.

As shown in FIG. 1, the plurality of LEDs in each LED unit is divided into a plurality of LED segments with each LED segment having an associated voltage controlled current limiting device. Except for the first and last LED segments, each LED segment has a positive end and a negative end connected respectively to the negative end of its preceding LED segment and the positive end of its following LED segment.

The voltage controlled current limiting device is a three-terminal device that has a first terminal connected to the negative end of its associated LED segment, a second terminal connected to a bias voltage and a third terminal connected to a common node in the LED unit. In each LED driving circuit, the power-loss reduction circuit 102a or 102b and the current source 103a or 103b are connected in series between the common node of the LED unit and ground. The operational principle of the three-terminal voltage controlled current limiting device in the LED unit and the power-loss reduction circuit has been disclosed in detail in U.S. Pat. No. 8,847,501, which is incorporated herewith by reference, and will not be repeated in this specification.

In the present invention, the two driving circuits may comprise different or identical circuits. For example, the LED unit 101*a* may be the same as or different from the LED unit 101*b*, and the power-loss reduction circuit 102*a* may also be the same as or different from the power-loss reduction circuit 102*b*. In the embodiment shown in FIG. 1, the current $I_a$ of the current source 103*a* in the LED driving circuit shown on the left side is also controlled by the universal controller 100.

According to the present invention, when the input voltage $V_{IN}$ is in a range from rectified 90 volt AC to rectified 140 volt AC, for example, a rectified 110 volt AC voltage, switch SW1 is turned on and switch SW2 is turned off by the universal controller 100. At the same time, the current source 103*a* is also turned on. As a result, the two LED driving circuits are connected in parallel.

When the input voltage $V_{IN}$ is in a range from rectified 180 volt AC to rectified 265 volt AC, for example, a rectified 220 volt AC voltage, switch SW1 is turned off and switch SW2 is turned on so as to connect the LED segments of the LED unit 101*a* in series with the LED driving circuit shown on the right side of FIG. 1. At the same time, the universal controller 100 controls the current $I_a$ flowing through the current source 103*a* according to voltage variation in the input voltage $V_{IN}$.

The voltage variation in the input voltage $V_{IN}$ can be detected by directly sensing the input voltage $V_{IN}$, or detecting a related node voltage such as the voltage at one end of switch SW2, or a branch current of the LED driving circuits such as the current $I_b$ of the current source 103*b*. The switch SW2 may also be a passive switch such as a diode.

According to the present invention, when the input voltage $V_{IN}$ is not large enough to make the LED driving circuit shown on the right side of FIG. 1 conductive, the current source 103*a* is turned on. However, when the input voltage $V_{IN}$ is large enough to make the LED driving circuit shown on the right side of FIG. 1 conductive, the current source 103*a* is turned off.

Figure 2:
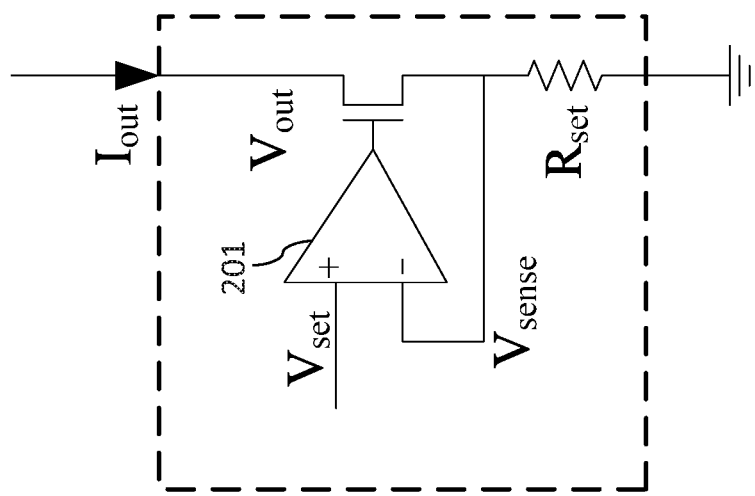
FIG. 2 shows an example of the current source in the block diagram of the preferred embodiment of FIG. 1.

FIG. 2 shows an example for the current source 103*a*. The current source has a differential amplifier 201 that receives a current setting signal Vset and a current sensing signal Vsense to control a transistor device. The current of the current source set by the current setting signal Vset equals to Vset/Rset, where Rset is a current setting resistor connecting the transistor device to ground and the actual current of the current source is Vsense/Rset.

When the voltage Vout is less than the headroom voltage of the current source, the output current $I_{out}$=Vsense/Rset of the current source is less than Vset/Rset. When the voltage Vout is greater or equal to the headroom voltage, the output current $I_{out}$=Vsense/Rset is identical to Vset/Rset.

Figure 3:
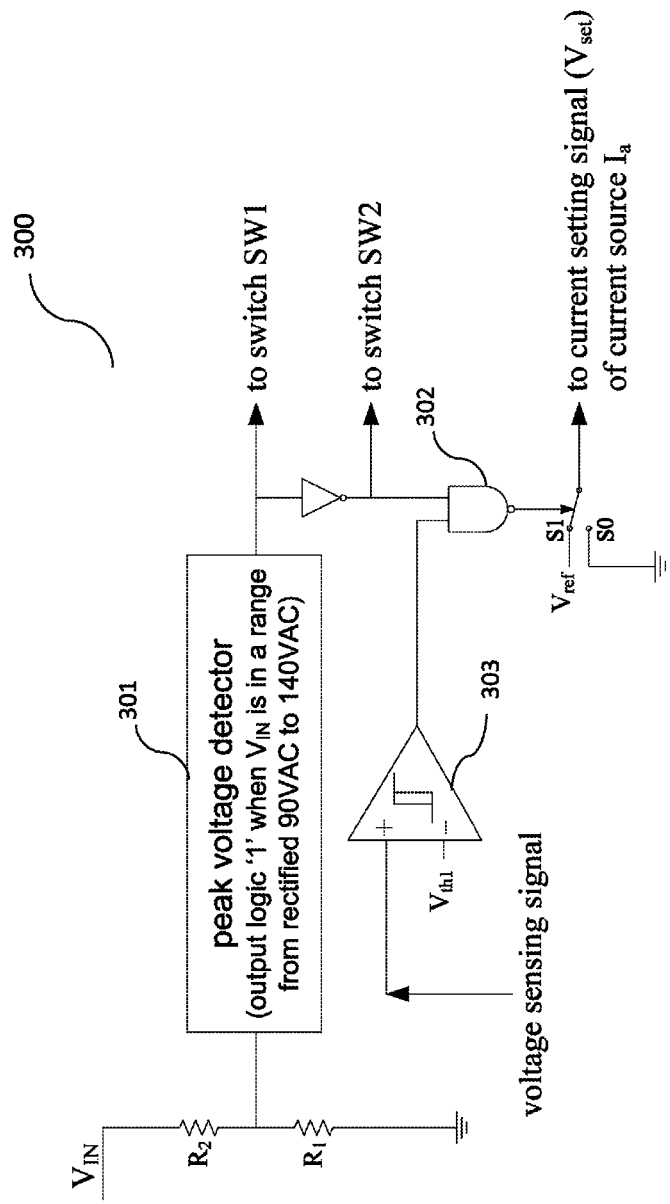
FIG. 3 shows an example of the universal controller in the block diagram of the preferred embodiment of FIG. 1.

As mentioned above, the universal controller 100 controls how the two switches SW1 and SW2 are turned on or turned off to connect the two LED driving circuits according to the input voltage $V_{IN}$. FIG. 3 shows an example of the block diagram of the universal controller. In the universal controller 300 of FIG. 3, a peak voltage detector 301 outputs logic "1" when the input voltage $V_{IN}$ is in a range from rectified 90 volt AC to rectified 140 volt AC. As a result, switch SW1 is turned on and switch SW2 is turned off. In the meantime, NAND gate 302 also selects position S1 and sends reference voltage Vref to the current source 103*a* shown in FIG. 2 as the current setting signal Vset to turn on the current source 103*a*.

In the universal controller 300, the peak voltage detector 301 outputs logic "0" when the input voltage $V_{IN}$ is in a range from rectified 180 volt AC to rectified 265 volt AC, switch SW1 is turned off and switch SW2 is turned on. A voltage comparator 303 compares a voltage sensing signal with a threshold voltage $V_{th1}$. If the voltage sensing signal is less than the threshold voltage $V_{th1}$, NAND gate 302 also selects and sends the reference voltage Vref to the current source 103*a* as the current setting signal to turn on the current source 103*a*. If the voltage sensing signal is greater than the threshold voltage $V_{th1}$, NAND gate 302 selects position S0, and the current source 103*a* is turned off because the current setting signal is connected to ground. In this example, the voltage sensing signal may be connected to the output of the resistive voltage divider consisting of resistors R1 and R2 or some other related node in the LED driving circuit.

Figure 4:
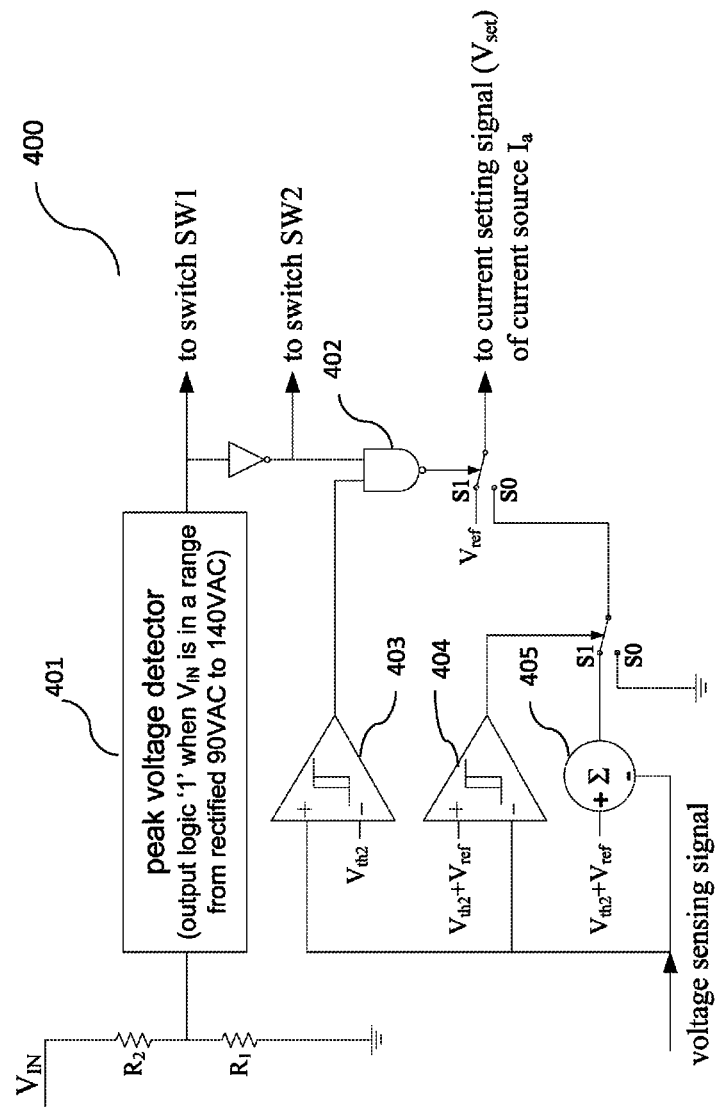
FIG. 4 shows another example of the universal controller in the block diagram of the preferred embodiment of FIG. 1.

FIG. 4 shows another example of the block diagram of the universal controller. Similar to the example shown in FIG. 3, in the universal controller 400 of FIG. 4, a peak voltage detector 401 outputs logic "1" when the input voltage $V_{IN}$ is in a range from rectified 90 volt AC to rectified 140 volt AC. As a result, switch SW1 is turned on and switch SW2 is turned off. In the meantime, NAND gate 402 also enables the reference voltage Vref to be sent to the current source 103*a* shown in FIG. 2 as the current setting signal Vset to turn on the current source 103*a*.

In the universal controller 400, the peak voltage detector 401 outputs logic "0" when the input voltage $V_{IN}$ is in a range from rectified 180 volt AC to rectified 265 volt AC, switch SW1 is turned off and switch SW2 is turned on. In this example, there are two voltage comparators 403 and 404, and a voltage subtractor 405 in the universal controller 400. The voltage sensing signal is compared in both comparators. If the voltage sensing signal is less than the threshold voltage $V_{th2}$, the output of the comparator 403 makes NAND gate 402 enable the reference voltage Vref to be sent to the current source 103*a* as the current setting signal to turn on the current source 103*a*. If the voltage sensing signal is greater than the threshold voltage $V_{th2}$+Vref, the output of the comparator 404 selects position S0 and the current source 103*a* is turned off because the current setting signal is connected to ground.

In this example, if the voltage sensing signal is between $V_{th2}$ and $V_{th2}$+Vref, the current setting signal of the current source 103*a* comes from the output of the voltage subtractor 405 which is between 0 and Vref by subtracting the voltage sensing signal from the voltage $V_{th2}$+Vref. Because the current source 103*a* has a current transition state in addition to the turn-on and turn-off states, this example has the advantage that the effects of flicker, EMI, power loss and low power factor caused by the sudden switching between the turn-on and turn-off states can be reduced. Similar to the example of FIG. 3, the voltage sensing signal may be connected to the output of the resistive voltage divider consisting of resistors R1 and R2 or some other related node in the LED driving circuit.

Figure 5:
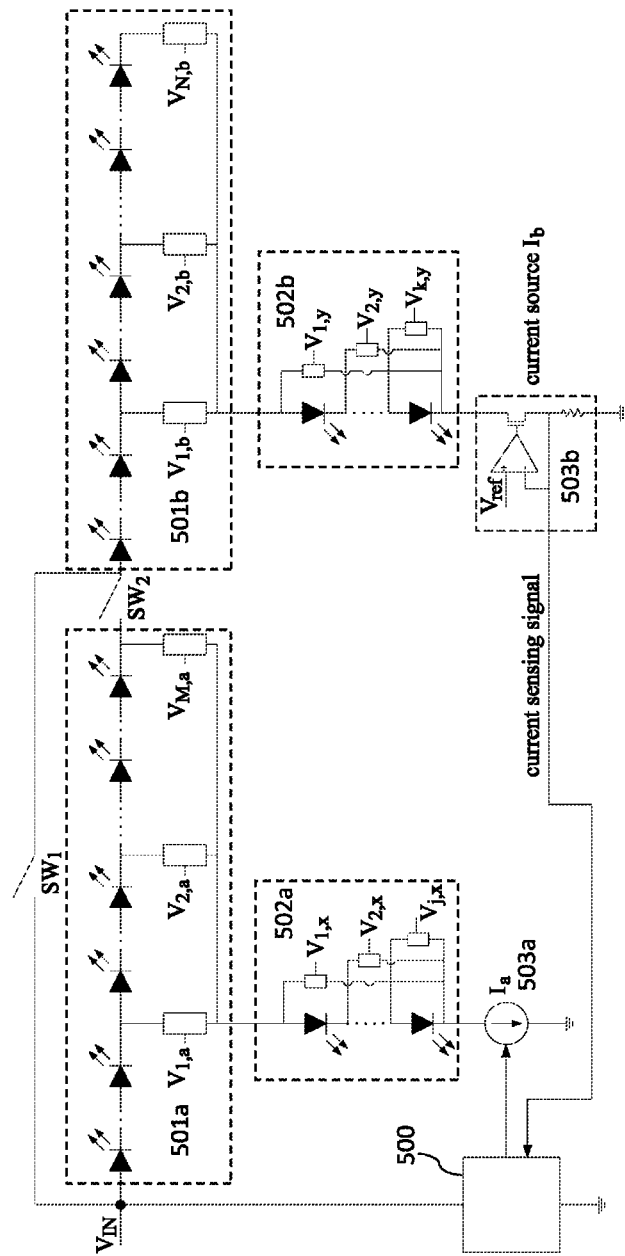
FIG. 5 shows a block diagram of an apparatus for driving LEDs using high voltage according to a modified version of the preferred embodiment of the present invention shown in FIG. 1.

FIG. 5 shows a block diagram of an apparatus for driving LEDs using high voltage according to a modified version of the preferred embodiment of the present invention shown in FIG. 1. In the embodiment, the apparatus also comprises two LED driving circuits and two switches SW1, SW2 controlled by a universal controller 500. The LED driving circuit shown on the left side of FIG. 5 includes an LED unit 501a connected in series with a power-loss reduction circuit 502a and a current source 503a. The LED driving circuit shown on the right side of FIG. 5 includes an LED unit 501b connected in series with a power-loss reduction circuit 502b and a current source 503b.

As shown in FIG. 5, in addition to controlling the current source 503a, the universal controller 500 in this embodiment receives a current sensing signal from the current source 503b so that the current $I_a$ of the current source 503a can be determined by sensing current $I_b$ flowing through the current source 503b.

Figure 6:
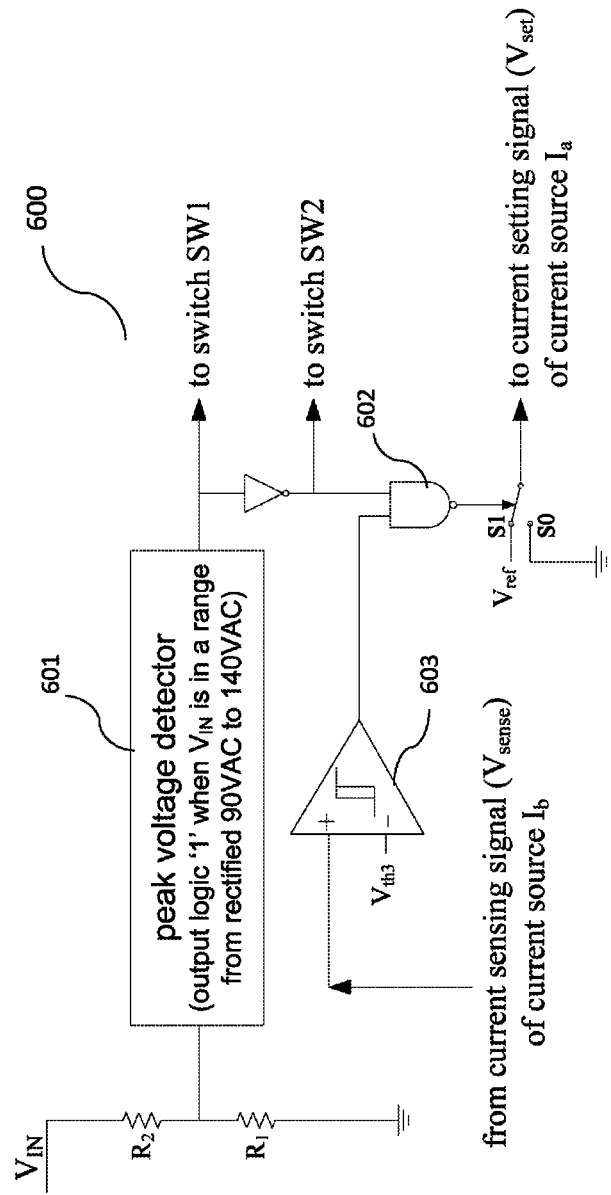
FIG. 6 shows an example of the universal controller in the block diagram of the preferred embodiment of FIG. 5.

FIG. 6 shows an example of the block diagram of the universal controller 500 in the preferred embodiment shown in FIG. 5. The universal controller 600 of FIG. 6 is very similar to the universal controller 300 of FIG. 3 except for the voltage comparator 603. The operation of the universal controller 600 when the input voltage $V_{IN}$ is in a range from rectified 90 volt AC to rectified 140 volt AC is the same as that in the universal controller 300 of FIG. 3.

In the universal controller 600, the peak voltage detector 601 outputs logic "0" when the input voltage $V_{IN}$ is in a range from rectified 180 volt AC to rectified 265 volt AC, switch SW1 is turned off and switch SW2 is turned on. The voltage comparator 603 compares the voltage sensing signal, which is the current sensing signal Vsense from the current source 503b, with a threshold voltage $V_{th3}$. If the voltage sensing signal is less than the threshold voltage $V_{th3}$, NAND gate 602 enables the reference voltage Vref to be sent to the current source 503a as the current setting signal to turn on the current source 503a. If the voltage sensing signal is greater than the threshold voltage $V_{th3}$, NAND gate 602 selects position S0, and the current source 503a is turned off because the current setting signal is connected to ground. As a result, the current $I_a$ of the current source 503a is determined by sensing the current $I_b$ flowing through the current source 503b in this embodiment.

Figure 7:
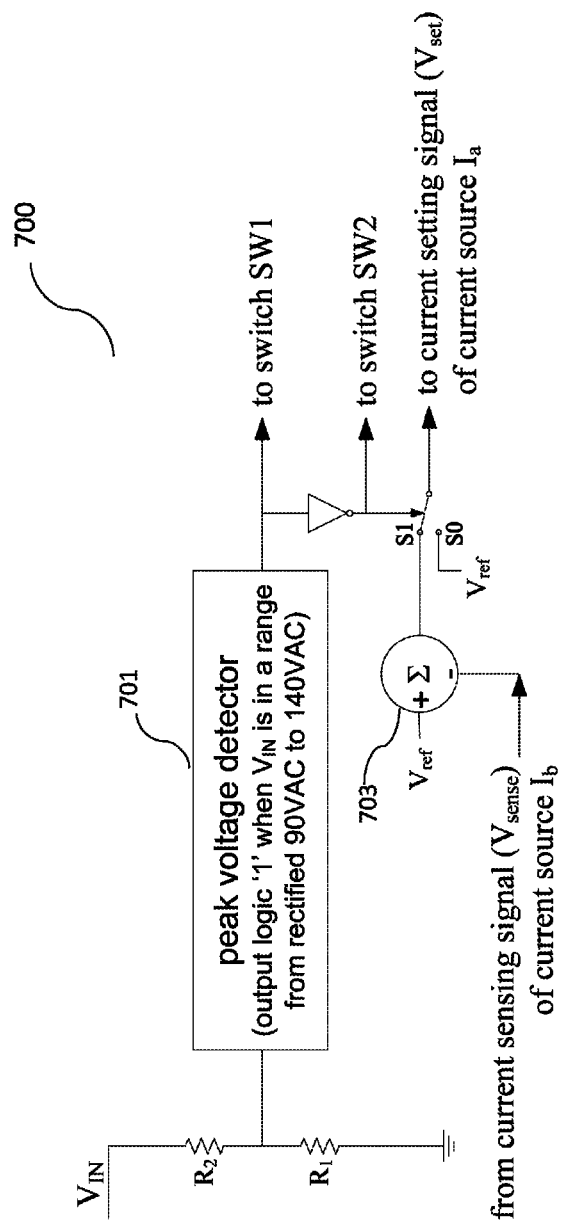
FIG. 7 shows another example of the universal controller in the block diagram of the preferred embodiment of FIG. 5.

FIG. 7 shows another example of the block diagram of the universal controller 500 in the preferred embodiment shown in FIG. 5. As shown in FIG. 7, a peak voltage detector 701 outputs logic "1" when the input voltage $V_{IN}$ is in a range from rectified 90 volt AC to rectified 140 volt AC. As a result, switch SW1 is turned on and switch SW2 is turned off. In this case, the selector that selects the voltage sent as the current setting signal Vset of the current source 503a is positioned to S0 to output reference voltage Vref to turn on the current source 503a.

In the universal controller 700, the peak voltage detector 701 outputs logic "0" when the input voltage $V_{IN}$ is in a range from rectified 180 volt AC to rectified 265 volt AC, switch SW1 is turned off and switch SW2 is turned on. A voltage subtractor 703 subtracts the current sensing signal of the current source 503b from reference voltage Vref to output a subtracted voltage at position S1. As shown in FIG. 7, the selector that selects the voltage sent as the current setting signal Vset of the current source 503a is positioned to S1.

Therefore, the current $I_a$ of the current source 503a is determined by the current $I_b$ flowing through the current source 503b in this example. As the current $I_b$ increases, the current $I_a$ decreases. Because the current source 503a has a current transition state in addition to the turn-on and turn-off states, this example also has the advantage that the effects of flicker, EMI, power loss and low power factor caused by the sudden switching between the turn-on and turn-off states can be reduced.

Figure 8:
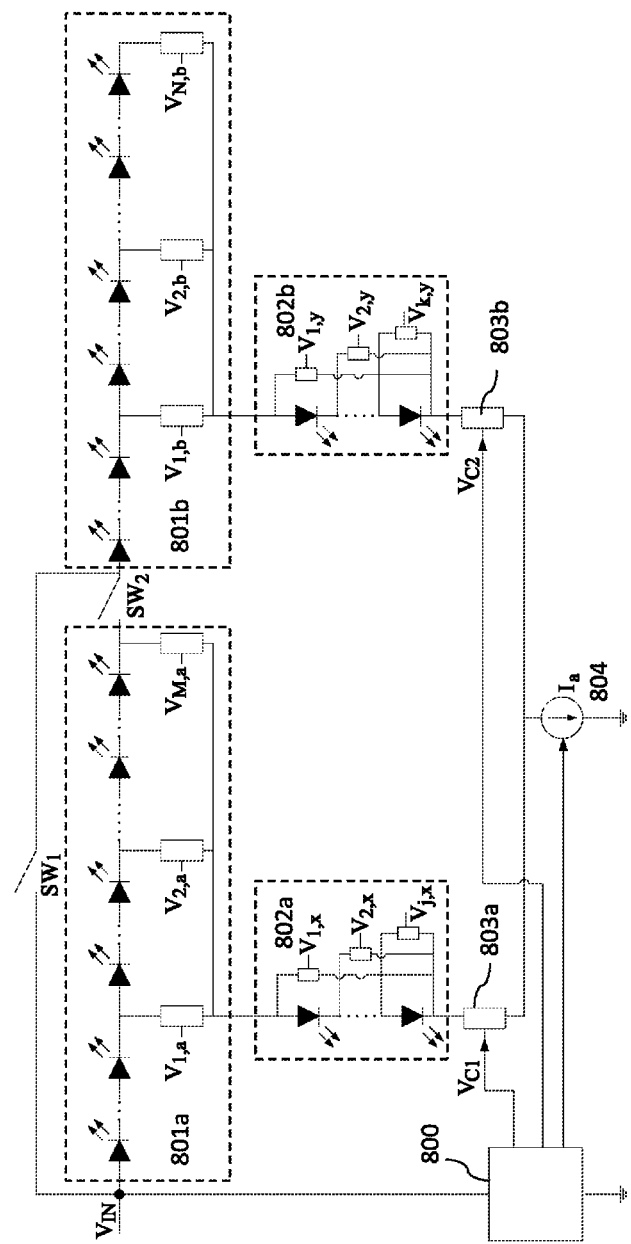
FIG. 8 shows a block diagram of an apparatus for driving LEDs using high voltage according to another preferred embodiment of the present invention.

FIG. 8 shows a block diagram of an apparatus for driving LEDs using high voltage according to another preferred embodiment of the present invention. In the embodiment, the apparatus comprises two LED driving circuits and two switches SW1, SW2 controlled by a universal controller 800. The LED driving circuit shown on the left side of FIG. 8 includes an LED unit 801a connected in series with a power-loss reduction circuit 802a and a voltage controlled current limiting device 803a. The LED driving circuit shown on the right side of FIG. 8 includes an LED unit 801b connected in series with a power-loss reduction circuit 802b and a voltage controlled current limiting device 803b. A current source 804 connects both voltage controlled current limiting devices 803a and 803b to ground.

Figure 9:
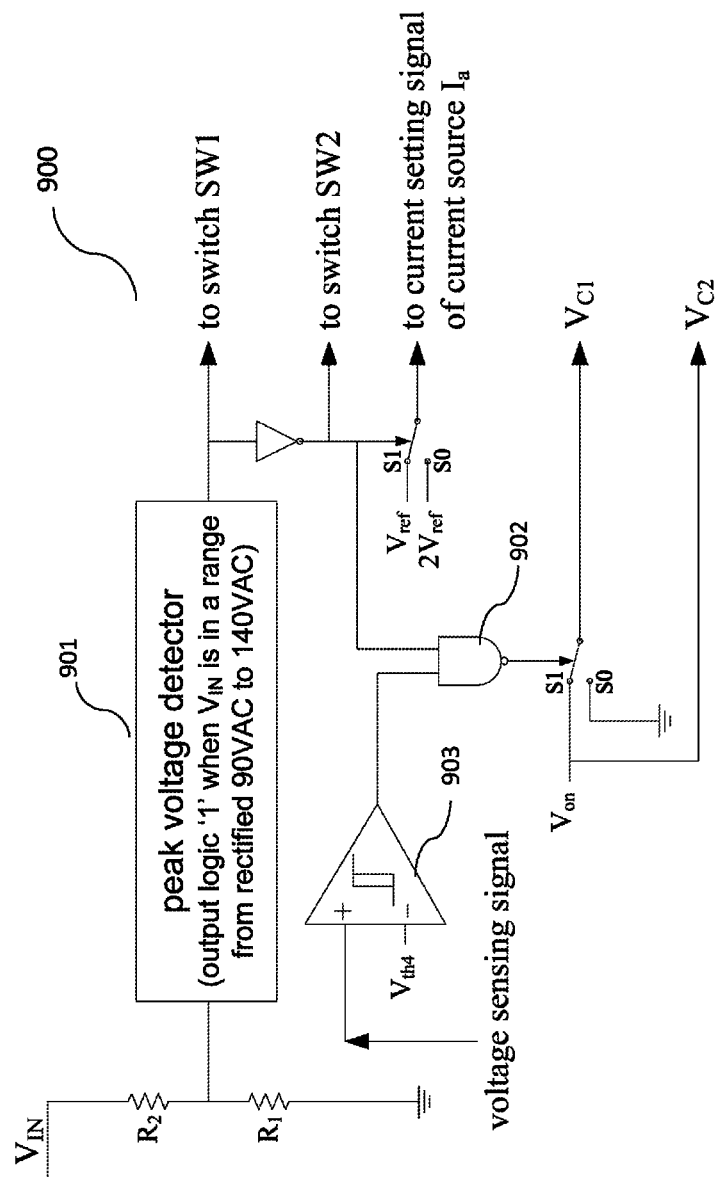
FIG. 9 shows an example of the universal controller in the block diagram of the preferred embodiment of FIG. 8.

In this embodiment, the universal controller 800 controls the two switches SW1, SW2, the two voltage controlled current limiting devices 803a, 803b and the current source 804. FIG. 9 is a block diagram of an example 900 of the universal controller 800. As shown in FIG. 9, the universal controller 900 comprises a peak voltage detector 901 that outputs logic "1" when the input voltage $V_{IN}$ is in a range from rectified 90 volt AC to rectified 140 volt AC. $V_{C1}$ and $V_{C2}$ are control voltages for the two voltage controlled current limiting devices 803a and 803b respectively with $V_{C2}$ being connected to a voltage $V_{ON}$.

As a result, switch SW1 is turned on and switch SW2 is turned off. In the meantime, the selector that selects the voltage sent as the current setting signal Vset of the current source 804 is positioned to S0 to output a voltage level equal to 2Vref to turn on the current source 804 with a current twice of the current flowing through each LED driving circuit. The selector that selects the voltage provided for $V_{C1}$ is positioned to S1 by a NAND gate 902 to pass voltage $V_{ON}$ to $V_{C1}$. In this example, the control voltages $V_{C1}$ and $V_{C2}$ of the two voltage controlled current limiting devices 803a and 803b are both set to $V_{ON}$.

In the universal controller 900, the peak voltage detector 901 outputs logic "0" when the input voltage $V_{IN}$ is in a range from rectified 180 volt AC to rectified 265 volt AC, switch SW1 is turned off and switch SW2 is turned on. The selector that selects the voltage sent as the current setting signal Vset of the current source 804 is positioned to S1 to output a voltage level equal to Vref to turn on the current source 804.

A voltage comparator 903 compares a voltage sensing signal with a threshold voltage $V_{th4}$. If the voltage sensing signal is less than the threshold voltage $V_{th4}$, the selector that selects the voltage provided for $V_{C1}$ is positioned to S1 by the NAND gate 902 to pass voltage $V_{ON}$ to $V_{C1}$ and, therefore, the control voltages $V_{C1}$ and $V_{C2}$ of the two voltage controlled current limiting devices 803a and 803b are both set to $V_{ON}$. At this moment, because the input voltage $V_{IN}$ is not large enough to drive both LED driving circuits connected in series, only voltage controlled current limiting device 803a controlled by $V_{C1}$ has a current flowing through.

If the voltage sensing signal is greater than the threshold voltage $V_{th4}$, the selector that selects the voltage provided for $V_{C1}$ is positioned to S0 to connect $V_{C1}$ to ground, only $V_{C2}$ is provided with $V_{ON}$ and, therefore, only the voltage controlled current limiting device 803b controlled by $V_{C2}$ has a current flowing through. In this example, the voltage sensing signal may be connected to the output of the resistive voltage divider consisting of resistors R1 and R2 or some other related node in the LED driving circuit.

Figure 10:
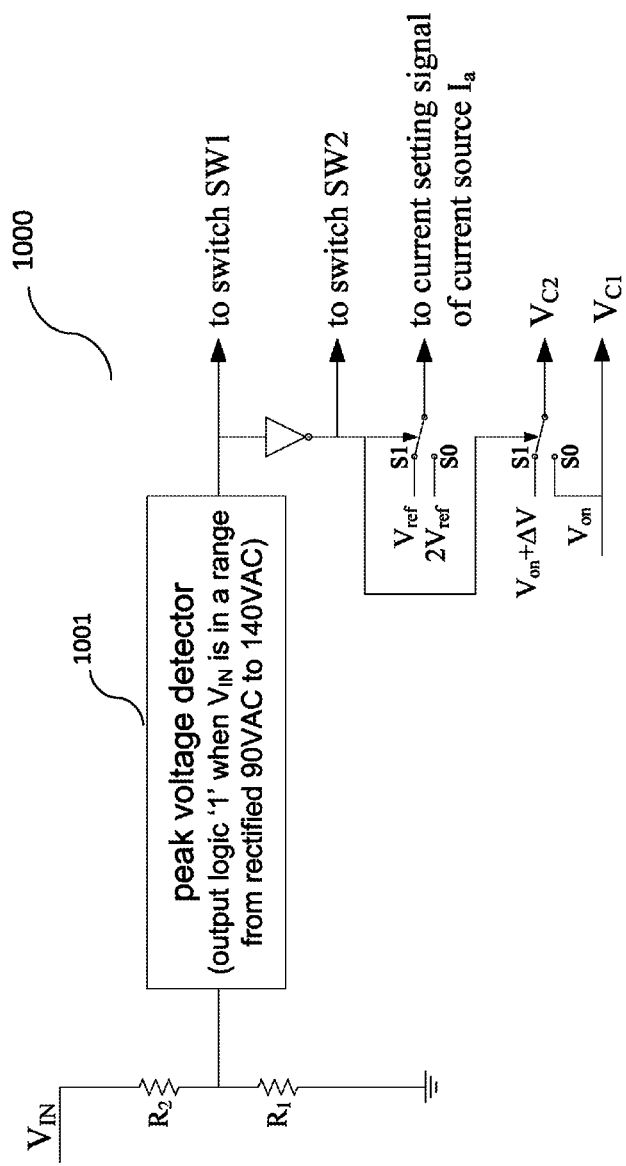
FIG. 10 shows another example of the universal controller in the block diagram of the preferred embodiment of FIG. 8.

FIG. 10 shows another example 1000 of the block diagram of the universal controller 800 in the preferred embodiment shown in FIG. 8. As shown in FIG. 10, the universal controller 1000 comprises a peak voltage detector 1001 that outputs logic "1" when the input voltage $V_{IN}$ is in a range from rectified 90 volt AC to rectified 140 volt AC.

Therefore, switch SW1 is turned on and switch SW2 is turned off. In the meantime, the selector that selects the voltage sent as the current setting signal Vset of the current source 804 is positioned to S0 to output a voltage level equal to 2Vref to turn on the current source 804 with a current twice of the current flowing through each LED driving circuit. The selector that selects the voltage provided for $V_{C2}$ is positioned to S0 to pass voltage $V_{ON}$ to $V_{C2}$, and the control voltages $V_{C1}$ and $V_{C2}$ of the two voltage controlled current limiting devices 803a and 803b are both set to $V_{ON}$.

The peak voltage detector 1001 outputs logic "0" when the input voltage $V_{IN}$ is in a range from rectified 180 volt AC to rectified 265 volt AC, switch SW1 is turned off and switch SW2 is turned on. The selector that selects the voltage sent as the current setting signal Vset of the current source 804 is positioned to S1 to output a voltage level equal to Vref to turn on the current source 804. The selector that selects the voltage provided for $V_{C2}$ is also positioned to S1 to pass the voltage sum of voltage $V_{ON}$ and a differential voltage, i.e., $V_{ON}+\Delta V$ to $V_{C2}$.

When the input voltage $V_{IN}$ is not large enough to drive both LED driving circuits connected in series, only voltage controlled current limiting device 803a controlled by $V_{C1}$ has a current flowing through. When the input voltage $V_{IN}$ is large enough to drive both LED driving circuits connected in series and the current starts to flow through the voltage controlled current limiting device 803b controlled by $V_{C2}$, the voltage at the node where the current source 804 is connected to the two voltage controlled current limiting devices 803a and 803b will increase.

As a result, the current flowing through the voltage controlled current limiting device 803a controlled by $V_{C1}$ will decrease and finally reduce to zero. Only the voltage controlled current limiting device 803b controlled by $V_{C2}$ has a current flowing through. Because the two voltage controlled current limiting devices 803a and 803b are gradually switched, this example has the advantage that the effects of flicker, EMI, power loss and low power factor caused by the sudden switching between the turn-on and turn-off states can be reduced.

In the two examples shown in FIGS. 9 and 10, two different reference voltage levels, i.e., Vref or 2Vref are used to control the current flowing through the current source 804. The current source shown in FIG. 2 is an example that can be used so that the current flowing through the current source 804 can be controlled according to the current setting signal which is either Vref or 2Vref.

Figure 11:
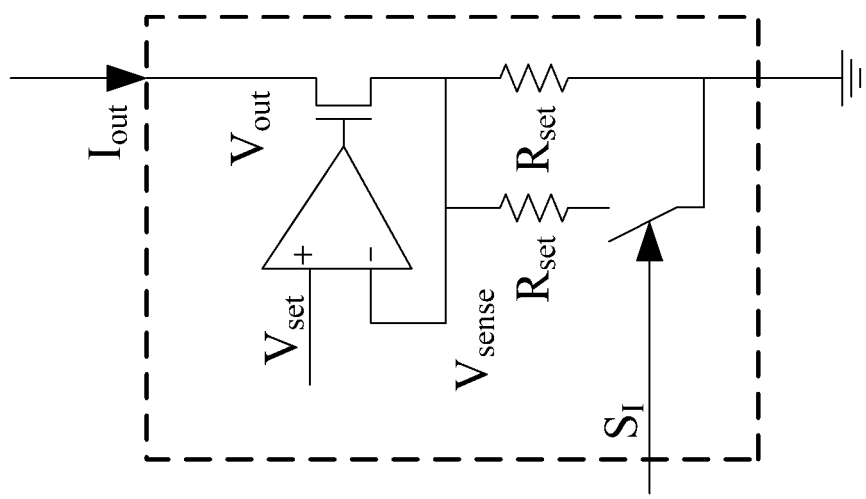
FIG. 11 shows an example of a current source that includes a current selecting switch for enabling one current setting resistor to be connected in parallel with the other current setting resistor so as to double the current flowing through the current source.

FIG. 11 shows a current source in which the current flowing through the current source can be controlled by a switch $S_I$. In comparison with the current source shown in FIG. 2, the current source of FIG. 11 has one additional resistor Rset controlled by $S_I$ that can be connected in parallel with another resistor Rset to double the current flowing through the current source with the same Vref as the current setting signal without using 2Vref.

Figure 12:
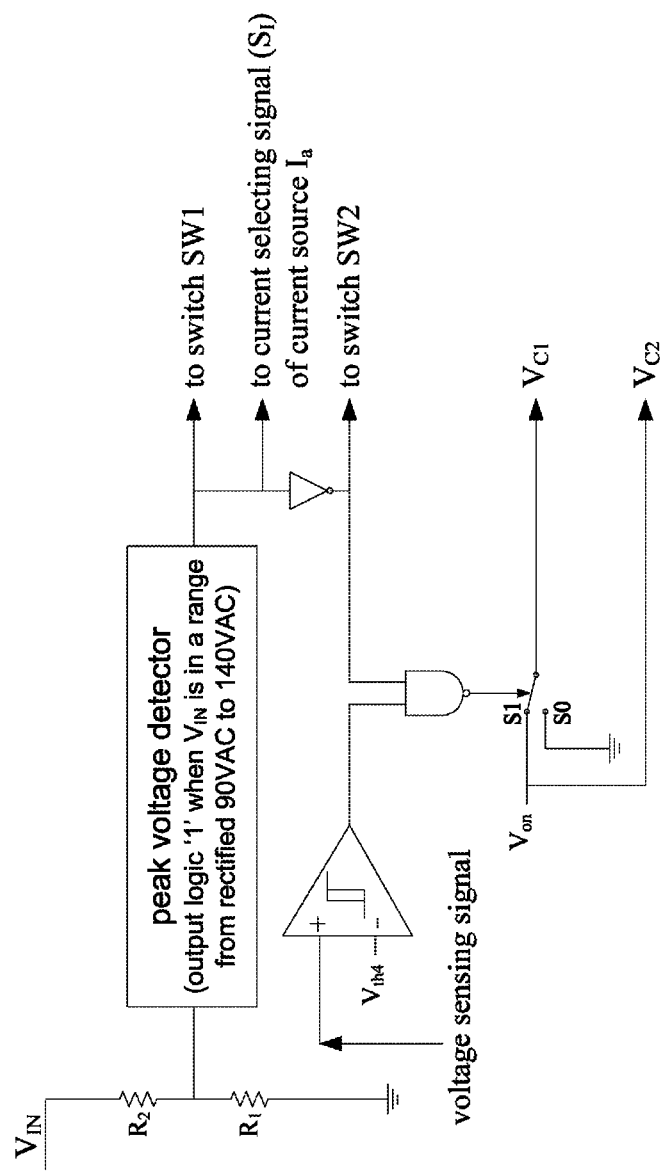
FIG. 12 shows an example of the universal controller in the block diagram of the preferred embodiment of FIG. 8 in which the current source shown in FIG. 11 is used.

The current source shown in FIG. 11 can be used in the preferred embodiment shown in FIG. 8 to simplify the circuit of the universal controller 800. FIG. 12 shows an example of the block diagram of the universal controller 800 that can be used with the current source of FIG. 11. As can be seen from FIG. 12, the universal controller is almost identical to the one shown in FIG. 9 except that the selector which selects reference voltage Vref or 2Vref passed as the current setting signal of the current source 804 is eliminated. Instead, a current selecting signal $S_1$ is provided for controlling the current flowing through the current source 804.

Figure 13:
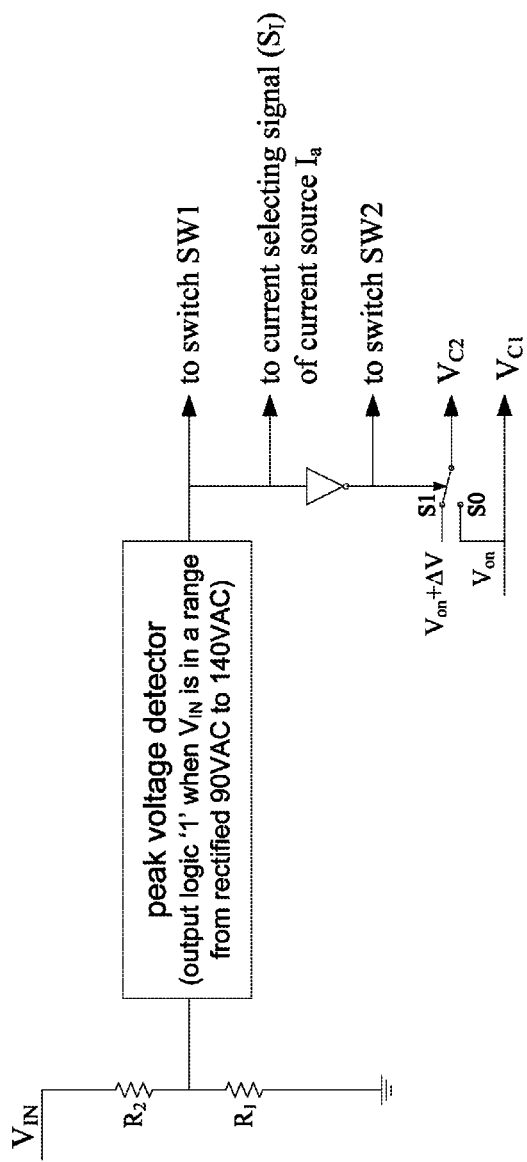
FIG. 13 shows another example of the universal controller in the block diagram of the preferred embodiment of FIG. 8 in which the current source shown in FIG. 11 is used.

Similarly, with the current source shown in FIG. 11, the example of the block diagram of the universal controller 800 shown in FIG. 10 can be simplified as shown in FIG. 13. As can be seen from FIG. 13, the universal controller is almost identical to the one shown in FIG. 10 except that the selector associated with passing reference voltages Vref or 2Vref to the current setting signal of the current source 804 is eliminated. Instead, a current selecting signal $S_I$ is provided for controlling the current flowing through the current source 804.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. An apparatus for driving a plurality of LEDs, comprising:
    first and second LED driving circuits, each LED driving circuit including:
        a plurality of LEDs divided into a plurality of LED segments connected in series including a leading LED segment and a trailing LED segment, each of said plurality LED segments having a positive end and a negative end;
        a plurality of voltage controlled current limiting devices, each of said plurality of voltage controlled current limiting devices being associated with one of said plurality of LED segments, and having a first terminal connected to the negative end of the associated LED segment, a second terminal being applied with a bias voltage and a third terminal being connected to a common node;
        a power-loss reduction circuit having a positive end connected to said common node; and
        a current source having a first end connected to a negative end of said power-loss reduction circuit and a second end connected to ground;
    a first switching device having a first end connected to the positive end of the leading LED segment of said first LED driving circuit, and a second end connected to the positive end of the leading LED segment of said second LED driving circuit;
    a second switching device having a first end connected to the negative end of the trailing LED segment of said first LED driving circuit, and a second end connected to the positive end of the leading LED segment of said second LED driving circuit;
    a universal controller controlling said first and second switching devices and the current source of said first LED driving circuit; and
    an input voltage connected to the positive end of the leading LED segment of said first LED driving circuit and said universal controller;
    wherein said first switching device is turned on and said second switching device is turned off when said input voltage is between rectified 90 volt AC to rectified 140 volt AC, and said first switching device is turned off and said second switching device is turned on when said input voltage is between rectified 180 volt AC to rectified 265 volt AC.

2. The apparatus as claimed in claim 1, wherein said second switching device is a diode.

3. The apparatus as claimed in claim 1, wherein the current source of said first LED driving circuit has a current setting resistor Rset and a node Vset for receiving a current setting signal from said universal controller.

4. The apparatus as claimed in claim 3, where said universal controller comprises:
   a peak voltage detector having an input node and an output node, said output node sending a first switch control signal for controlling said first switching device;
   input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;
   an inverter inverting said first switch control signal to form a second switch control signal for controlling said second switching device;
   a voltage comparator comparing a voltage sensing signal with a threshold voltage and outputting a voltage comparison signal;
   a NAND gate receiving said second switch control signal and said voltage comparison signal and outputting a voltage selection signal; and
   a voltage selector controlled by said voltage selection signal for selecting a reference voltage or a ground voltage as said current setting signal to control the current source of said first LED driving circuit.

5. The apparatus as claimed in claim 4, wherein said voltage sensing signal is connected to the input node of said peak voltage detector.

6. The apparatus as claimed in claim 4, wherein the current source of said second LED driving circuit has a current sensing resistor connected to ground and a voltage level across said current sensing resistor is fed back to said universal controller as said voltage sensing signal.

7. The apparatus as claimed in claim 3, where said universal controller comprises:
   a peak voltage detector having an input node and an output node, said output node sending a first switch control signal for controlling said first switching device;
   input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;
   an inverter inverting said first switch control signal to form a second switch control signal for controlling said second switching device;
   a voltage subtractor subtracting a voltage sensing signal from a reference voltage and outputting a subtracted voltage; and
   a voltage selector controlled by said second switch control signal for selecting said subtracted voltage or said reference voltage as said current setting signal to control the current source of said first LED driving circuit;
   wherein the current source of said second LED driving circuit has a current sensing resistor connected to ground and a voltage level across said current sensing resistor is fed back to said universal controller as said voltage sensing signal.

8. The apparatus as claimed in claim 3, where said universal controller comprises:
   a peak voltage detector having an input node and an output node, said output node sending a first switch control signal for controlling said first switching device;
   input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;
   an inverter inverting said first switch control signal to form a second switch control signal for controlling said second switching device;
   a first voltage comparator comparing a voltage sensing signal with a threshold voltage and outputting a first voltage comparison signal;
   a NAND gate receiving said second switch control signal and said first voltage comparison signal and outputting a voltage selection signal;
   a first voltage selector controlled by said voltage selection signal for selecting a reference voltage or a transitional voltage as said current setting signal to control the current source of said first LED driving circuit;
   a second voltage comparator comparing said voltage sensing signal with a sum of said threshold voltage and said reference voltage and outputting a second voltage comparison signal;
   a voltage subtractor subtracting said voltage sensing signal from the sum of said threshold voltage and said reference voltage and outputting a subtracted voltage; and
   a second voltage selector controlled by said second voltage comparison signal for selecting said subtracted voltage or a ground voltage as said transitional voltage.

9. The apparatus as claimed in claim 8, wherein said voltage sensing signal is connected to the input node of said peak voltage detector.

10. An apparatus for driving a plurality of LEDs, comprising:
    first and second LED driving circuits, each LED driving circuit including:
      a plurality of LEDs divided into a plurality of LED segments connected in series including a leading LED segment and a trailing LED segment, each of said plurality LED segments having a positive end and a negative end;
      a plurality of voltage controlled current limiting devices, each of said plurality of voltage controlled current limiting devices being associated with one of said plurality of LED segments, and having a first terminal connected to the negative end of the associated LED segment, a second terminal being applied with a bias voltage and a third terminal being connected to a common node;
      a power-loss reduction circuit having a positive end connected to said common node; and
      a bottom voltage controlled current limiting device having a first terminal connected to a negative end of said power-loss reduction circuit, a second terminal connected to a control voltage, and a third terminal;
    a first switching device having a first end connected to the positive end of the leading LED segment of said first LED driving circuit, and a second end connected to the positive end of the leading LED segment of said second LED driving circuit;
    a second switching device having a first end connected to the negative end of the trailing LED segment of said first LED driving circuit, and a second end connected to the positive end of the leading LED segment of said second LED driving circuit;

a current source having a first end connected to the third terminals of the bottom voltage controlled current limiting devices of said first and second LED driving circuits and a second end connected to ground;

a universal controller controlling said first and second switching devices and said current source, and providing the control voltages of the bottom voltage controlled current limiting devices of said first and second LED driving circuits; and an input voltage connected to the positive end of the leading LED segment of said first LED driving circuit and said universal controller;

wherein said first switching device is turned on, said second switching device is turned off, and the two control voltages are set identical when said input voltage is between rectified 90 volt AC to rectified 140 volt AC, and said first switching device is turned off, said second switching device is turned on and the control voltage of the bottom voltage controlled current limiting device of said second LED driving circuit is set greater than or equal to the control voltage of the bottom voltage controlled current limiting device of said first LED driving circuit when said input voltage is between rectified 180 volt AC to rectified 265 volt AC.

11. The apparatus as claimed in claim 10, wherein said second switching device is a diode.

12. The apparatus as claimed in claim 10, wherein said current source has a current setting resistor Rset and a node Vset for receiving a current setting signal sent from said universal controller.

13. The apparatus as claimed in claim 12, where said universal controller comprises:

a peak voltage detector having an input node and an output node, said output node sending a first switch control signal for controlling said first switching device;

input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;

an inverter inverting said first switch control signal to form a second switch control signal for controlling said second switching device;

a first voltage selector controlled by said second switch control signal for selecting a reference voltage $V_{ref}$ or twice of the reference voltage $2V_{ref}$ as said current setting signal to control said current source;

a voltage comparator comparing a voltage sensing signal with a threshold voltage and outputting a voltage comparison signal;

a NAND gate receiving said second switch control signal and said voltage comparison signal and outputting a voltage selection signal;

a turn-on voltage $V_{ON}$ as the control voltage of the bottom voltage controlled current limiting device of said second LED driving circuit; and a second voltage selector controlled by said voltage selection signal for selecting said turn-on voltage $V_{ON}$ or a ground voltage as the control voltage of the bottom voltage controlled current limiting device of said first LED driving circuit;

wherein said first switching device is turned on, said second switching device is turned off, said twice of the reference voltage $2V_{ref}$ is selected as said current setting signal to control said current source and the two control voltages are both set to $V_{ON}$ when said input voltage is between rectified 90 volt AC to rectified 140 volt AC, and said first switching device is turned off, said second switching device is turned on and said reference voltage $V_{ref}$ is selected as said current setting signal to control said current source when said input voltage is between rectified 180 volt AC to rectified 265 volt AC.

14. The apparatus as claimed in claim 13, wherein said voltage sensing signal is connected to the input node of said peak voltage detector.

15. The apparatus as claimed in claim 13, wherein when said input voltage is between rectified 180 volt AC to rectified 265 volt AC and said voltage sensing signal is less than said threshold voltage, the two control voltages are both set to $V_{ON}$, and when said input voltage is between rectified 180 volt AC to rectified 265 volt AC and said voltage sensing signal is greater than said threshold voltage, the control voltage of the bottom voltage controlled current limiting device of said first LED driving circuit is set to said ground voltage.

16. The apparatus as claimed in claim 12, where said universal controller comprises:

a peak voltage detector having an input node and an output node, said output node sending a first switch control signal for controlling said first switching device;

input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;

an inverter inverting said first switch control signal to form a second switch control signal for controlling said second switching device;

a first voltage selector controlled by said second switch control signal for selecting a reference voltage $V_{ref}$ or twice of the reference voltage $2V_{ref}$ as said current setting signal to control said current source;

a turn-on voltage $V_{ON}$ as the control voltage of the bottom voltage controlled current limiting device of said first LED driving circuit; and a second voltage selector controlled by said second switch control signal for selecting said turn-on voltage $V_{ON}$ or a sum of said turn-on voltage $V_{ON}$ and a differential voltage $\Delta V$ as the control voltage of the bottom voltage controlled current limiting device of said second LED driving circuit;

wherein said first switching device is turned on, said second switching device is turned off, said twice of the reference voltage $2V_{ref}$ is selected as said current setting signal to control said current source and the two control voltages are both set to $V_{ON}$ when said input voltage is between rectified 90 volt AC to rectified 140 volt AC, and said first switching device is turned off, said second switching device is turned on and said reference voltage $V_{ref}$ is selected as said current setting signal to control said current source when said input voltage is between rectified 180 volt AC to rectified 265 volt AC.

17. The apparatus as claimed in claim 16, wherein when said input voltage is between rectified 180 volt AC to rectified 265 volt AC, the control voltage of the bottom voltage controlled current limiting device of said second LED driving circuit is set to said sum of said turn-on voltage $V_{ON}$ and said differential voltage $\Delta V$.

18. The apparatus as claimed in claim 10, wherein said current source has two current setting resistors Rset connected with one being controllable by a current selection switch so as to be connected in parallel with the other or disconnected.

19. The apparatus as claimed in claim 18, where said universal controller comprises:
- a peak voltage detector having an input node and an output node, said output node sending a first switch control signal for controlling said first switching device and said current selection switch of said current source;
- input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;
- an inverter inverting said first switch control signal to form a second switch control signal for controlling said second switching device;
- a voltage comparator comparing a voltage sensing signal with a threshold voltage and outputting a voltage comparison signal;
- a NAND gate receiving said second switch control signal and said voltage comparison signal and outputting a voltage selection signal;
- a turn-on voltage $V_{ON}$ as the control voltage of the bottom voltage controlled current limiting device of said second LED driving circuit; and
- a voltage selector controlled by said voltage selection signal for selecting said turn-on voltage $V_{ON}$ or a ground voltage as the control voltage of the bottom voltage controlled current limiting device of said first LED driving circuit;
- wherein said first switching device is turned on, said second switching device is turned off and the two control voltages are both set to $V_{ON}$ when said input voltage is between rectified 90 volt AC to rectified 140 volt AC, and said first switching device is turned off and said second switching device is turned on when said input voltage is between rectified 180 volt AC to rectified 265 volt AC.

20. The apparatus as claimed in claim 19, wherein said voltage sensing signal is connected to the input node of said peak voltage detector.

21. The apparatus as claimed in claim 19, wherein when said input voltage is between rectified 180 volt AC to rectified 265 volt AC and said voltage sensing signal is less than said threshold voltage, the two control voltages are both set to $V_{ON}$, and when said input voltage is between rectified 180 volt AC to rectified 265 volt AC and said voltage sensing signal is greater than said threshold voltage, the control voltage of the bottom voltage controlled current limiting device of said first LED driving circuit is set to said ground voltage.

22. The apparatus as claimed in claim 18, where said universal controller comprises:
- a peak voltage detector having an input node and an output node, said output node sending a first switch control signal for controlling said first switching device and said current selection switch of said current source;
- input voltage divider resistors $R_1$ and $R_2$, one end of $R_2$ being connected to said input voltage and the other end of $R_2$ being connected to one end of $R_1$ and the input node of said peak voltage detector, and the other end of $R_1$ being connected to ground;
- an inverter inverting said first switch control signal to form a second switch control signal for controlling said second switching device;
- a turn-on voltage $V_{ON}$ as the control voltage of the bottom voltage controlled current limiting device of said first LED driving circuit; and
- a voltage selector controlled by said second switch control signal for selecting said turn-on voltage $V_{ON}$ or a sum of said turn-on voltage $V_{ON}$ and a differential voltage $\Delta V$ as the control voltage of the bottom voltage controlled current limiting device of said second LED driving circuit;
- wherein said first switching device is turned on, said second switching device is turned off and the two control voltages are both set to $V_{ON}$ when said input voltage is between rectified 90 volt AC to rectified 140 volt AC, and said first switching device is turned off and said second switching device is turned on when said input voltage is between rectified 180 volt AC to rectified 265 volt AC.

23. The apparatus as claimed in claim 22, wherein when said input voltage is between rectified 180 volt AC to rectified 265 volt AC, the control voltage of the bottom voltage controlled current limiting device of said second LED driving circuit is set to said sum of said turn-on voltage $V_{ON}$ and said differential voltage $\Delta V$.

* * * * *